United States Patent [19]

Uber et al.

[11] Patent Number: 4,633,515

[45] Date of Patent: Dec. 30, 1986

[54] EMERGENCY BROADCAST ALERT DETECTOR

[75] Inventors: Harry B. Uber, Kootenai County, Id.; George Staschek, Jr., Spokane County, Wash.

[73] Assignee: Harry B. Uber, Post Falls, Id.

[21] Appl. No.: 598,210

[22] Filed: Apr. 9, 1984

[51] Int. Cl.⁴ .................... H03J 7/24; H04B 1/16
[52] U.S. Cl. ............................. 455/166; 455/32; 455/156; 455/228; 340/329
[58] Field of Search ............ 455/32, 35, 33, 57, 455/161, 169, 166, 195, 227, 228, 229, 156; 381/24, 25, 74, 120, 123; 340/648, 329; 331/179

[56] References Cited

U.S. PATENT DOCUMENTS

| | | | |
|---|---|---|---|
| 2,882,390 | 4/1959 | Kuhl, Jr. et al. | 455/228 |
| 3,124,749 | 3/1964 | Craig | 455/57 |
| 3,701,024 | 10/1972 | Knowles et al. | 455/228 |
| 4,009,442 | 2/1977 | von Brömssen | 455/166 |
| 4,031,467 | 6/1977 | Singleton, Jr. et al. | 455/57 |
| 4,218,773 | 8/1980 | Imamura | 455/166 |
| 4,340,973 | 7/1982 | Umetsu | 455/228 |
| 4,392,248 | 7/1983 | Eckels et al. | 455/228 |
| 4,551,855 | 11/1985 | Kurosaki et al. | 455/32 |

FOREIGN PATENT DOCUMENTS 0106990 6/1983 Japan .................... 381/123

*Primary Examiner*—Jin F. Ng
*Assistant Examiner*—M. Huseman
*Attorney, Agent, or Firm*—Seed and Berry

[57] ABSTRACT

An emergency broadcast alert detector having a radio receiver scanning among several predetermined frequencies. The audio output of the radio receiver is connected to a noise detector that allows scanning to continue as long as noise indicative of no signal being received is present on the audio output. When the radio receiver scans to a frequency on which a broadcast is present, the lack of noise on the audio output of the receiver causes scanning to discontinue. The audio output is also connected to a tone detector that generates an alarm for a predetermined period in the even that an alert tone of a predetermined frequency is present on the audio output of the radio receiver.

4 Claims, 3 Drawing Figures

EMERGENCY BROADCAST ALERT DETECTOR

TECHNICAL FIELD

This invention relates to an emergency broadcast alerting system, and more particularly, to an emergency alert detector capable of monitoring several frequencies while in an inactive mode, locking onto a broadcast on one of the monitored frequencies, and then sounding an audible or visual alarm when a predetermined "alert" tone is detected in the received broadcast.

BACKGROUND ART

An extensive radio system for alerting the public to national and regional emergencies has been implemented. For example, broadcasts of the National Oceanic and Atmospheric Administration (N.O.A.A.) wheather radio stations transmitting at about 162 MHz are adapted to broadcast emergency messages. In the N.O.A.A. emergency system, an emergency message is preceded by a broadcast of a 1.05 kHz tone.

The limitations of the N.O.A.A. emergency broadcast system as well as other broadcast systems, are essentially twofold. First, the frequency to which the radio receiver should be set varies geographically. Thus, as the radio receiver travels from place to place, in the case of an automobile radio, it is necessary to retune the radio to pick up the N.O.A.A. broadcast at the new frequency. Even where the location of the radio is fixed, there may be a need to retune the receiver. For example, if a relatively close N.O.A.A. transmitter goes off the air, it may be necessary to tune to a more distant N.O.A.A. transmitter at a different frequency. While variations in the frequency to which the receiver should be tuned is not a problem when the receiver is being monitored, it is a problem where the receiver is unmonitored.

The second limitation mentioned above stems from the need to monitor the radio receiver to not only retune, if necessary, but also to detect the presence of the "alert" tone preceding an emergency broadcast. Insofar as nonemergency N.O.A.A. broadcast repeat the same information over a fairly short interval, a listener will not generally desire to continuously listen to a N.O.A.A. broadcast. Also, of course, an emergency broadcast can occur during the late evening or early morning hours when most of the population is asleep. Thus, it can be expected that a relatively small percentage of the population would be alerted to an emergency condition by the N.O.A.A. weather radio network or any emergency broadcast system.

The above-described limitations of the emergency broadcast system, as it is presently configured, have been addressed by radio receivers monitoring a broadcast station in an inactive mode and then switching to an active mode when an "alert" tone, indicative of an emergency condition, is transmitted. Thus, U.S. Pat. No. 4,031,467, to Singleton, Jr., et al., discloses a radio alerting system including a master station and several receivers. The receivers are normally inactive, but they become active upon receiving respective predetermined control tones modulating the received signal. The master station selects receivers for receipt of a message by selectively modulating the transmitter signal with appropriate control tones.

U.S. Pat. No. 3,701,024, to Knowles et al., discloses a radio warning system in which the output of a receiver is connected to a detector that detects a predetermined number of pulses at a predetermined frequency and then closes a gate to apply the audio output of the receiver to a power amplifier and loudspeaker. The Knowles et al. system also selects between two different receivers, depending upon whether one of the receivers is detecting a broadcast signal.

U.S. Pat. No. 3,124,749, to Craig, discloses an emergency broadcast control device that applies predetermined tones and a blanking signal to a broadcast signal.

These prior attempts to improve the usefulness of the emergency broadcast system do not address the problem of locating the frequency at which the broadcast is transmitted while a receiver is unattended. Nor do the prior art systems address the problem of being too expensive to be placed in widespread use or of being too high in power consumption to operate over a long period of time on battery power. Other limitations inherent in the prior art systems will become apparent in comparison with the inventive emergency broadcast alert detector described herein.

DISCLOSURE OF INVENTION

It is an object of the invention to provide a receiver for monitoring a radio frequency to detect an alert signal indicative of an emergency condition while in an inactive mode drawing relatively little power.

It is another object of the invention to provide an emergency broadcast detector that is capable of monitoring several frequencies for the presence of a broadcast on which an "alert" tone would be broadcast in the event of an emergency condition.

It is still another object of the invention to provide an emergency broadcast detector that is automatically reset after detection of an alert signal so that subsequently received alert signals can be detected.

It is a further object of the invention to provide a detector capable of receiving an emergency broadcast on one of several frequencies yet is relatively inexpensive and compact.

These and other objects of the invention are provided by an emergency broadcast alert detector for use in an emergency warning system in which an "alert" tone indicative of an emergency conditoin is transmitted on one of several frequencies. The detector includes a radio receiver having a tuner scanning among the several possible transmission frequencies, with the tuner being prevented from further scanning in response to a disable signal. A noise detector is connected to the audio output of the radio receiver to generate the disable signal except when noise is detected at the audio output. The radio receiver thus continuously scans among the several possible transmission frequencies until a broadcast signal rather than noise is detected. The receiver then locks onto that frequency. The output of the radio receiver is applied to a tone detector which generates an alarm signal to produce a visual or audible alarm when the "alert" tone is present at the audio output. The tuner in the radio receiver may include a local oscillator having several frequency selection inputs to control the transmission frequency being received. A sequencer having a clock input has its outputs connected to the frequency selection inputs of the radio receiver so that the receiver sequentially tunes to a new signal upon the occurrence of each clock pulse. The clock input of the sequencer is driven by a scanning oscillator when its output is gated by the lack of a disable signal from the noise detector. Thus, when noise is present at the output of the receiver, the signal from the scanning oscillator is gated to the sequencer to cause the signals applied to the frequency selection inputs to vary in sequence. In one embodiment, the local oscillator includes a crystal that substantially controls its frequency, but its frequency is pulled by reactive elements that are selectively connected to the crystal by switching diodes.

BEST MODE FOR CARRYING OTU THE INVENTION

Figure 1:
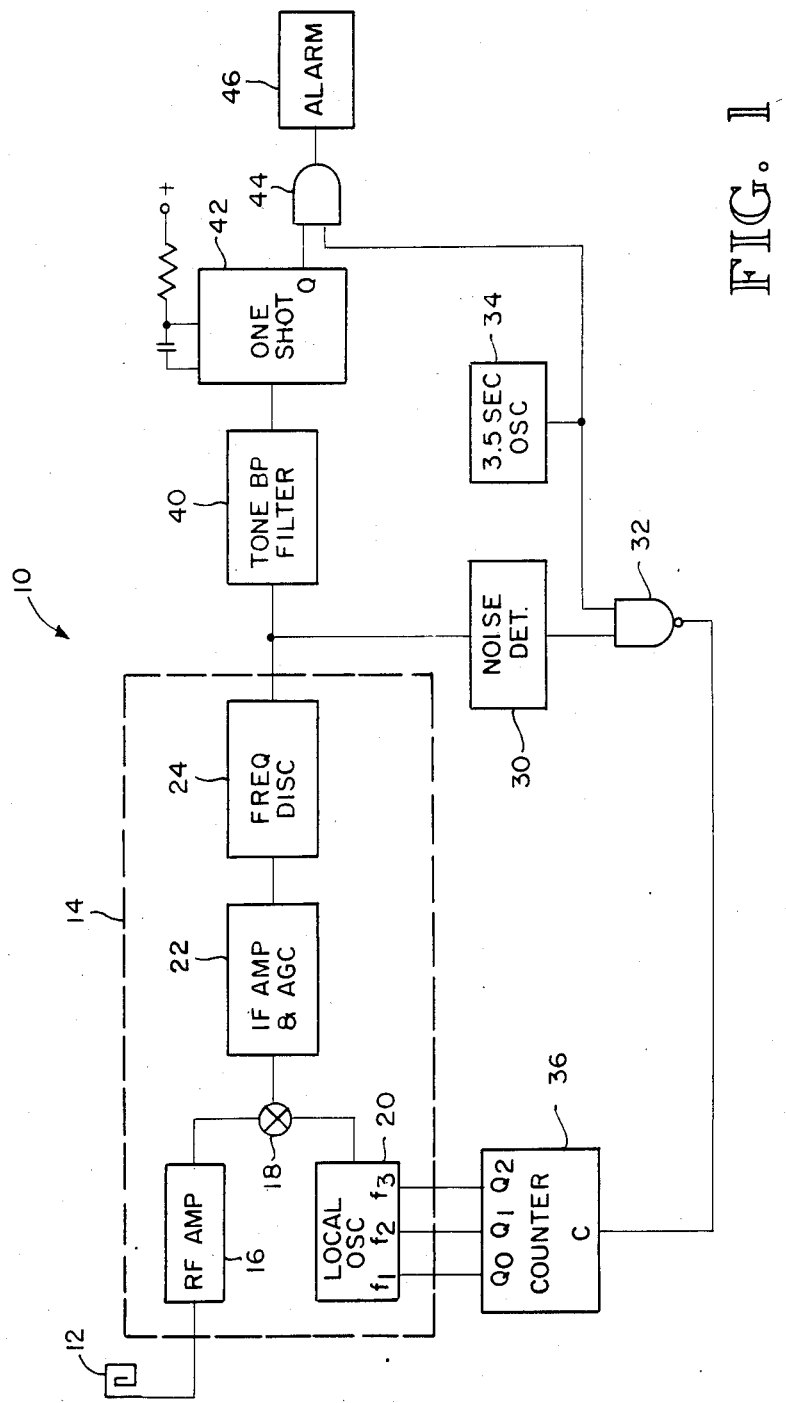
FIG. 1 is a block diagram of the emergency broadcast alert detector.

A block diagram of the inventive emergency broadcast alert detector 10 is illustrated in FIG. 1. The transmitter signal is picked up at antenna 12 and applied to a radio receiver 14. The radio receiver 14 includes an RF amplifier 16 that has some frequency selectivity at the frequency of the transmitted signal. The output of the RF amplifier 16 is applied to one input of a mixer 18 which receives at its other input the output of a local oscillator 20. The local oscillator 20 has a plurality of frequency selection inputs $f_1$, $f_2$, $f_3$ that determine the frequency of the local oscillator signal. As is well known in the art, the output of the mixer 18 is a signal having a frequency equal to that of the received signal at the output of the RF amplifier 16, that of the local oscillator signal at the output of local oscillator 20 and the sum and difference of those two frequencies. Insofar as the signals from the RF amplifier 16 and local oscillator 20 are relatively close to each other, the difference frequency at the output of mixer 18 is substantially lower than any of the other frequencies. This low-frequency difference signal is boosted by IF amplifier 22 to the exclusion of the remaining signals. Insofar as the IF frequency $f_i$ is fixed, the frequency of the received signal $f_c$ is selected by the frequency of the local oscillator signal $f_o$ since $f_c = f_o + f_i$.

The IF amplifier 22 also contains an automatic gain control (AGC) circuit that maintains the output of the amplifier 22 relatively constant. Finally, the IF signal at the output of amplifier 22 is decoded by a frequency discriminator 24 to generate an FM demodulated audio signal at its output.

The audio signal from the radio receiver 14 is applied to a noise detector 30 that generates a high logic level at its output when noise is present on the audio output of the radio. As is well known in the art, when an FM receiver is tuned to a frequency on which no signal is being broadcast, the resulting audio is very noisy. When the FM receiver is tuned to a frequency on which a broadcast is present, however, the audio signal is substantially lower in volume. A NAND-gate 32 receives the logic level from the noise detector and also a pulse train from a 3.5-second oscillator 34. When the noise detector 30 detects noise on the audio output of the radio 10, the pulse train from the oscillator 34 is gated by the NAND-gate 32 to the clock input of a counter 36 connected internally so that each of its three outputs sequentially go high. As each of its outputs sequentially goes high, the frequency of the local oscillator signal from oscillator 20 switches from one frequency to the next in sequence.

In operation, as long as noise is present at the output of the radio receiver 14, the pulses from oscillator 34 are gated to the counter 36 to cause the local oscillator to switch from one frequency to the next. When the local oscillator switches to a frequency that corresponds to a transmitter frequency on which a broadcast is present, the audio output from the radio receiver 14 no longer contains noise. Under these circumstances, the output of the noise detector 30 goes low, thereby disabling NAND-gate 32. Thereafter, since counter 36 is no longer being incremented, local oscillator 20 outputs a constant frequency, thereby causing the radio receiver 14 to lock onto the broadcast being received.

After the radio receiver 14 has locked onto a broadcast, its audio output is continuously monitored by a tone band-pass filter 40 that is frequency selective to the 1.05 kHz "alert" tone transmitted on the N.O.A.A. emergency broadcast system. It will be understood, however, that other systems utilizing different frequencies or combinations of tones can be detected in a similar manner. A one-shot 42 is triggered by the tone bandpass filter 40 upon the start of an "alert" tone, thereby enabling AND-gate 44. AND-gate 44 then gates the pulse train from 3.5-second oscillator 34 to a conventional alarm 46. Alarm 46 then produces a visible or audible alarm in a pulsating manner, as determined by the frequency of the oscillator 34.

Figure 2A:
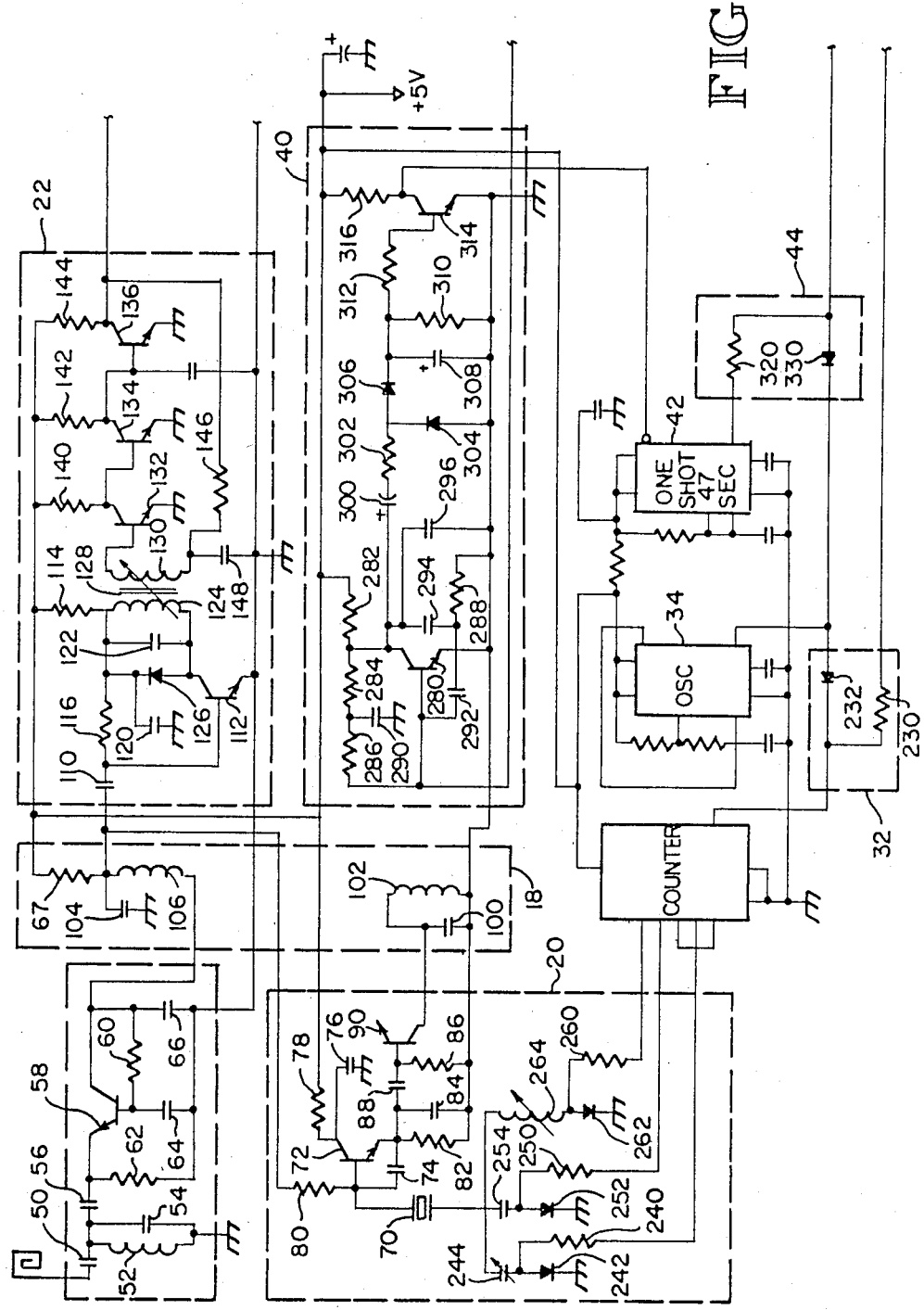
FIGS. 2A and 2B show a schematic of the emergency broadcast alert detector of FIG. 1.
Figure 2B:
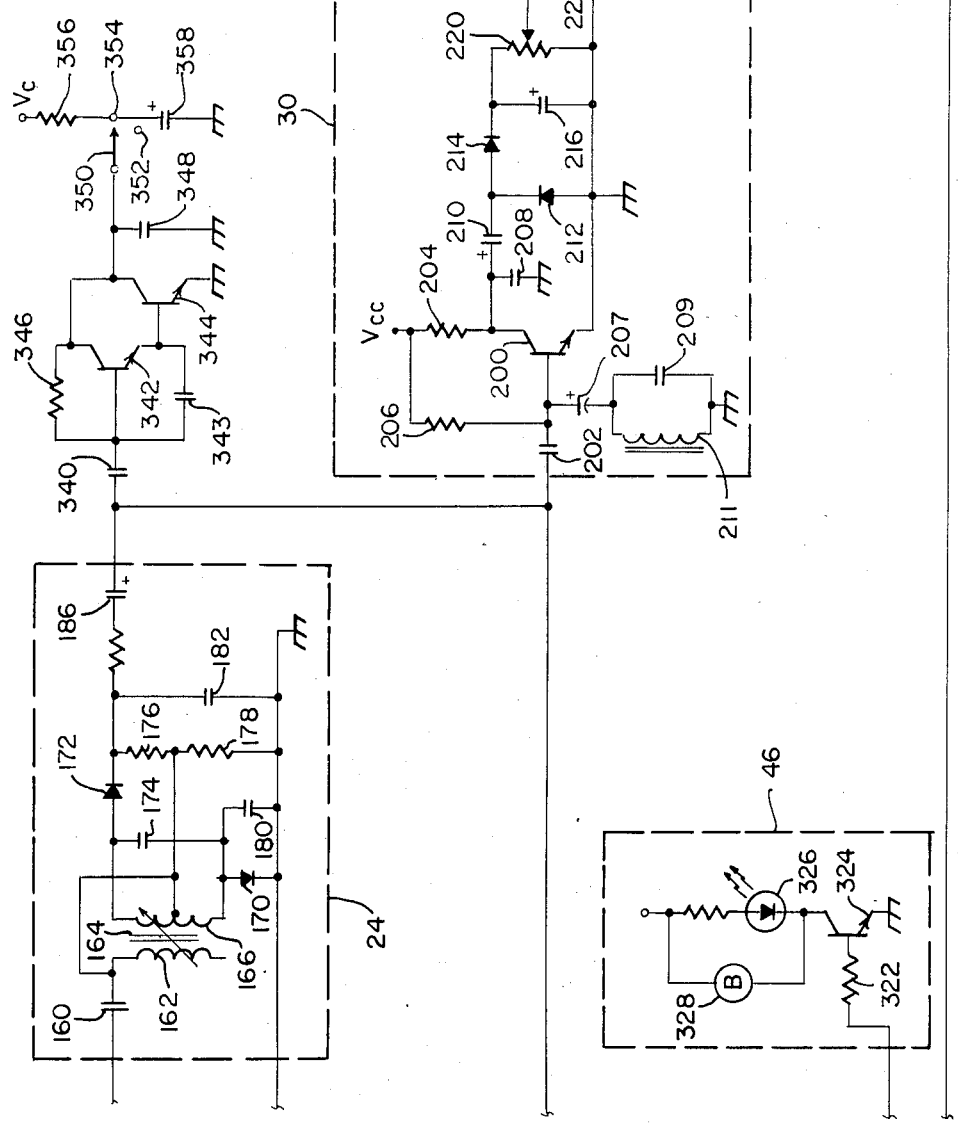

A schematic of the embodiment of FIG. 1 is illustrated in FIG. 2. The antenna 12 is coupled through capacitor 50 in RF amplifier 16 to a tank circuit consisting of inductor 52 and capacitor 54. The inductor 52 and capacitor 54 resonate at approximately the same frequency as the received signal and thus provide some frequency selectivity to the RF amplifier 16. The output of the tank circuit is applied through capacitor 56 to the emitter of an amplifying transistor 58 having its base biased through resistors 60 and 62. The base and collector of transistor 58 are grounded for high-frequency signals through capacitor 64 and capacitor 66, respectively. Power is applied to the transistor 58 through resistor 67. The gain of the amplifier is thus approximately equal to the ratio of resistor 60 to resistor 62.

The local oscillator 20 generates a local oscillator signal having a frequency primarily controlled by crystal 70. Crystal 70 is connected to a conventional oscillator circuit, including a transistor 72, having a feedback capacitor 74 connected between its emitter and base, a bypass capacitor 76 AC grounding the collector, a resistor 78 supplying power to the transistor 72, resistors 80 and 82 biasing the transistor 72, and a capacitor 84 bypassing resistor 82. The output at the emitter of transistor 72 is coupled to a load resistor 86 through a capacitor 88. The signal across resistor 86 is applied through the base collector junction of transistor 90 to the mixer 18.

The mixer 18 includes two tank circuits, the first of which is formed by capacitor 100 and inductor 102, and the second of which is formed by capacitor 104 and inductor 106. Capacitor 100 and inductor 102 resonate at the tenth harmonic of the crystal frequency, and this tenth harmonic is generated by the nonlinear characteristics of the base collector junction of transistor 90. Thus, the current flowing through the inductor 102 is at the tenth harmonic of the resonant frequency of the crystal 70 which in the embodiment shown herein, is 162 MHz. The inductor 106 and capacitor 104 resonate at the approximate frequency of the received signal. The inductors 102,106 are air-coupled to each other to effect a mixing function. Thus, the signal at the output of the mixer 18 includes the local oscillator signal frequency, the received signal, and the sum and difference of those two signals. These signals are applied to a frequency selective IF amplifier and AGC circuit 22 which amplifies the difference signal while attenuating the remaining high-frequency signals.

The IF amplifier and AGC circuit 22 includes a capacitor 110 through which the input is coupled to the base of transistor 112. Transistor 112 is biased through resistors 114 and 116, with the junction between resistors 114,116 bypassed to ground through capacitor 120. A tank circuit consisting of capacitor 122 and inductor 124 is connected between the collector of transistor 112 and the AC ground. A diode 126 is connected across the inductor 124 to dampen any reverse EMF transients which might otherwise damage transistor 112. The inductor 124 forms the primary of a transformer 128, which also includes inductor 130 as the secondary of the transformer 128. The inductor 124 and capacitor 122 resonate at an intermediate frequency approximately equal to the difference between the frequency of the local oscillator signal and the frequency of the received signal which in the embodiment shown herein is about 455 KHz. Since the intermediate frequency is constant, the frequency of the received signal is determined by the frequency of the local oscillator signal as explained above.

In operation, the bias voltage on transistor 132 is fixed on an operating point on the non-linear operating curve of the transistor 132. When transformer 128 and 164 are tuned to around 455 KHz, current flowing through transistor 112 causes the tank circuit formed by capacitor 122 and inductor 124 to oscillate at a fixed amplitude. The frequency of the oscillation varies in accordance with the incoming signal.

The secondary of the transformer 128 thus outputs only the difference signal. This is amplified by three transistors 132,134,136 having their collectors connected to DC power through resistors 140,142,144, respectively. The collector of transistor 136 is fed back to the base of transistor 132 through inductor 130 and resistor 146 to bias the transistors. No AC feedback is provided, however, because of the presence of capacitor 148. The transistors 132,134,136 are biased very close to cutoff so that they have somewhat of a nonlinear characteristic. As a result, the average base emitter current is proportional to the peak-to-peak value of the applied signal. As a result, as the AC signal from transformer 128 increases in amplitude, the bias level on the collector of transistor 132 decreases. This causes the DC level on the collector of transistor 134 to increase, which, in turn, causes the DC level in the collector of transistor 136 to decrease. This decreased DC bias is coupled through resistor 146 to the base of transistor 132, which tends to cause the collector voltage of transistor 132 to increase, thereby counteracting the decreasing collector voltage caused by an increase in the amplitude of the signal from transformer 128. This negative feedback results in a relatively constant value in the signal at the output of the IF amplifier 22. In this manner, the transistor circuit performs an automatic gain-controlling function.

The IF signal on the collector of transistor 136 is applied to the frequency discriminator 24, which, at its input stage, includes a series resonant circuit consisting of capacitor 160 and inductor 162 forming the primary of transformer 164. The capacitor 160 and inductor 162 also resonate at the IF frequency. The secondary 166 of transformer 164 is connected to a conventional frequency discriminator circuit consisting of diodes 170,172 and a capacitor 174 that may either be the internal capacitance of the transformer 164 or an external capacitor. The center tap of the secondary 166 is connected to a voltage divider network formed by resistors 176 and 178, which, in turn, are connected to the cathode of diode 172. A capacitor 180 is connected in parallel with diode 170. A capacitor 182 is connected in parallel with the voltage divider resistors 176,178 to roll off the frequency response of the frequency discriminator 24. The output of the frequency discriminator is AC-coupled through capacitor 186. The output of the frequency discriminator 24 is thus the audio signal that has been FM modulated on the signal received at the antenna 12.

The audio output from the receiver 14 is applied to the base of a transistor 200 in the noise detector 30 through capacitor 202. Transistor 200 is configured as a high-gain amplifier and is biased through resistors 204,206, with a capacitor 208 connected from its collector to ground to control the high-frequency response. A tank circuit formed by capacitor 209 and inductor 211 provides a band pass filter centered at between 10–12 KHz. Decoupling capacitor 207 prevents the base of transistor 200 from being shorted to ground at D.C.

The collector of the transistor 200 is connected through capacitor 210 to a conventional peak detector circuit consisting of diode 212 and diode 214. Capacitor 216 stores the peak voltage applied to diode 214 so that the DC voltage across capacitor 216 is proportional to the peak amplitude of the signal applied to the input of noise detector 30. As mentioned above, when the radio receiver 14 is not tuned to a broadcast, its audio output is a relatively high volume, thereby causing the voltage across capacitor 216 to be relatively high. This relatively high voltage is applied through potentiometer 220 to the base of transistor 222, which has its collector connected to power through resistor 224 in order to act as a switch. Potentiometer 220 is adjusted so that when noise is present on the audio output, the relatively high voltage across capacitor 216 saturates transistor 222 so that the voltage on the collector is relatively low. When the radio is tuned to a broadcast, the relatively low voltage across capacitor 216 drives the transistor 222 toward cutoff so that the voltage on the collector is relatively high. The output of the noise detector 30 may also be driven low by momentarily closing switch 225.

The output of the noise detector 30 is applied to the clock input of the counter 32 through resistor 230. The clock input of counter 32 also receives the output of the 3.5-second oscillator 34 through a diode 232. Whenever the output of the noise detector 30 is high, diode 232 is back-biased through resistor 230, thereby disconnecting the 3.5-second oscillator 34 from the counter 32. However, when the output of the noise detector 30 is low, a high at the output of the 3.5-second oscillator 34 is applied through the doide 232 to the counter 32. Resistor 230 and diode 232 thus perform an AND function to gate the output of the oscillator 34 to the counter whenever the noise detector 30 detects the presence of noise on the audio output.

As is well known in the art, the outputs of the counter 32 are configured so that each of the three inputs to the local oscillator 20 are sequentially driven high by each clock pulse. When the lowest output goes high, current flows to ground through resistor 240 and diode 242.

Diode 242 then connects capacitor 244 to ground, thereby forming a series combination of the capacitor 244 and crystal 70. The resonant frequency of this combination differs slightly from the resonant frequency of the crystal 70 alone. Similarly, when the middle output of counter 32 goes high, current flows to ground through resistor 250 and diode 252, thereby switching capacitor 254 in series with crystal 70. Finally, when the upper output of counter 32 goes high, current flows to ground through resistor 260 and diode 262, thereby switching inductor 264 in series with crystal 70. The inductive reactance of inductor 264 pulls the resonant frequency of the crystal 70 in the opposite direction, as does the capacitors 244 or 254. As the resonant frequency of the crystal 70 is pulled, the frequency of the local oscillator signal varies accordingly, thereby scanning among the several transmission frequencies. Although the embodiment illustrated in FIG. 2 sequentially connects individual reactive elements in series with crystal 70, it will be understood that other combinations of reactive elements can be used. For example, the capacitors 244 and 254 could be connected in parallel with each other, and this parallel combination connected in series with the crystal 70 by causing current to flow simultaneously through diodes 242 and 252.

In operation then, the low at the output of the noise detector 30 causes the pulses from oscillator 34 to be gated to the counter 36, thereby sequentially switching each of the capacitors 244,254 and inductor 264 in series with the crystal 70. The frequency of the local oscillator signal from the local oscillator 20 thus sequentially switches between three values. These three values sequentially select three frequencies for reception of transmitted signals. When a broadcast signal appears on one of these frequencies, the output of the noise detector 30 goes low, thereby back-biasing diode 232 to disconnect the oscillator 34 from the counter 36. The output of the counter 32 then remains in a static condition, thereby locking the receiver onto the broadcast station currently being received. Thereafter, the counter 34 may be advanced to the next station transmitting a broadcast signal by momentarily closing switch 225.

The audio output from the frequency discriminator 24 is also applied to the tone filter 40, as described above with reference to FIG. 1. The audio output is applied to the base of transistor 280, connected as a frequency-sensitive amplifier with resistors 282, 284, 286, 288, and capacitors 290, 292, 294, 296 in a known manner. The resistor and capacitor values are selected so that the gain of the transistor 280 peaks at 1.05 kHz. The collector of the transistor 280 is applied through capacitor 300 and resistor 302 to a peak detector circuit consisting of diodes 304 and 306. The peak voltage applied to diode 306 charges capacitor 308 to that value, and the capacitor slowly discharges through bleeder resistor 310. The peak voltage at the collector of transistor 280 at frequencies other than approximately 1.05 kHz is insufficient to generate a relatively large voltage across capacitor 308. However, when a signal of 1.05 kHz is applied to the base of transistor 280, a relatively large peak-to-peak signal is generated at the collector of transistor 280. This relatively large signal generates a relatively large DC voltage across capacitor 308, which is applied through resistor 312 to the base of transistor 314. Transistor 314 then saturates, thereby drawing sufficient current through resistor 316 so that the collector of transistor 314 is at substantially zero voltage.

One-shot 42 is triggered by a high-to-low transition at the output of the tone bypass filter. Thus, as soon as a 1.05 kHz tone is detected on the audio output from the frequency discriminator 24, the output of the tone bandpass filter 40 goes low, thereby triggering one-shot 42. One-shot 42 then outputs a high that is applied through resistor 320 and resistor 322 to the base of transistor 324. This high causes transistor 324 to saturate, thereby drawing current through a light-emitting diode 326 and a conventional piezo electric buzzer 328. The output of the 3.5-second oscillator 34 is also connected to the base of transistor 324 through resistor 322 and diode 330. Whenever the output of the oscillator 34 goes low, the base of the transistor 324 is pulled low through the diode 330, thereby cutting off the transistor 324 and terminating the flow of current through the light-emitting diode 326 and buzzer 328. The light-emitting diode 326 and buzzer 328 are thus intermittently powered to make their visual or audible signal more perceptible. When the output of the one-shot 42 is low, diode 330 is back-biased so that the output of the 3.5-second oscillator 34 is disconnected from the transistor 324 by diode 330. Also, of course, the light-emitting diode 326 and buzzer 328 will be unpowered in this condition. The one-shot 42 will then be in a reset condition so that it can be once again triggered if a subsequent "alert" tone is detected.

Although the alert detector is described as switching a buzzer 328 and L.E.D. 326, it will be understood that transistor 324 can switch any device or appliance. Similarly, in addition to being reset by the timing out of one-shot 42, it can also be reset manually.

The audio output from the frequency discriminator 24 is also connected to an audio amplifier through capacitor 340. The audio amplifier consists of transistors 342 and 344 connected as a Darlington pair and biased through resistor 346, with capacitor 343 providing high frequency compensation. As is well known in the art, transistors 342,344 connected in this manner have a very high input impedance and high gain. The collector of transistor 344 is filtered by capacitor 348 and connected to the center contact 350 of a conventional earphone jack 352. The outer contact 354 of the earphone jack 352 is connected to DC power through resistor 356 and to ground through capacitor 358. It is thus seen that, in the absence of an earphone or loudspeaker connecting the center conductor 350 to the outer conductor 354, transistors 342 and 344 are unpowered. This minimizes the power consumption of the circuit in order to ensure long battery life. When an earphone or loudspeaker is plugged into the jack 352, the coil of the earphone or speaker is connected between the center contact 350 and the outer contact 354, thereby powering the transistors 352,354 and allowing the earphone or speaker to receive the audio output from the collectors of transistors 342,344.

It is thus seen that the inventive emergency broadcast alert detector is capable of monitoring several radio frequencies to detect the presence of a broadcast signal. The radio receiver then locks onto the broadcast signal, and, in the event of an "alert" tone, produces a visible and audible alarm. In performing these functions, the detector utilizes little power and requires relatively few components, thereby minimizing its cost.

We claim:

1. In an emergency warning system in which an "alert" tone, indicative of an emergency condition, is transmitted by at least one of several stations on respective transmission frequencies, an emergency broadcast alert detector comprising:

(a) a radio receiver having an audio signal output and a tuner scanning among said transmission frequencies, sand tuner having:
   a local oscillator including a crystal substantially controlling the frequency of said local oscillator signal, said local oscillator signal further including a plurality of reactive elements connected to said crystal and a plurality of diodes connected with some of said reactive elements in a manner that switches the reactance of the respective reactive elements between two states, depending upon whether or not current is flowing through said diodes, said diodes being connected to respective frequency selection inputs of said local oscillator so that the frequency of said local oscillator signal is pulled from the resonant frequency of said crystal by said reactive elements being switched by current flowing from said frequency selection inputs through said diodes;
   a mixer receiving the output of said local oscillator and a transmitted signal, said mixer selecting a transmitted signal having a frequency equal to the sum of or difference between a fixed intermediate frequency and said local oscillator frequency;
   a decoder connected to the output of said mixer, said decoder generating as said audio output a signal corresponding to the modulation on the transmitted signal selected by said local oscillator;
   a clock generator producing a clock signal adapted to cause said tuner to scan from one transmission frequency to the next;
   a sequencer having a clock input and outputs connected to the frequency selection inputs of said local oscillator, said sequencer sequentially applying combinations of logic levels to said local oscillator responsive to clock pulses applied to said clock input; and
   a gate having its output connected to the clock input of said sequencer and inputs receiving said clock signal from said clock generator and a disable signal to gate said clock signal to the clock input of said sequencer when said disable signal is not being generated;

(b) a noise detector connected to the audio output of said radio receiver, said detector generating said disable signal except when said noise detector detects noise at said audio output, thereby indicating that no signal is being transmitted on the transmission frequency selected by said tuner, whereby said tuner continues to scan among said transmission frequencies until said tuner tunes to a station that is transmitting a signal;

(c) a tone detector connected to the audio output of said radio receiver, said tone detector generating an alarm signal when said "alert" tone is present at said audio output; and (d) an alarm connected to said tone detector, said alarm generating a visual or audible alarm responsive to receipt of said alarm signal.

2. In an emergency warning system in which an "alert" tone, indicative of an emergency condition, is transmitted by at least one of several stations on respective transmission frequencies, an emergency broadcast alert detector comprising:

a radio receiver having an audio signal output and a tuner scanning among said transmission frequencies, said tuner having a disable input that prevents said scanning from continuing responsive to a disable signal;

a noise detector connected to the audio output of said radio receiver, said detector generating said disable signal except when said noise detector detects noise at said audio output, thereby indicating that no signal is being transmitted on the transmission frequency selected by said tuner, whereby said tuner continues to scan among said transmission frequencies until said tuner tunes to a station that is transmitting a signal;

a tone detector connected to the audio output of said radio receiver, said tone detector generating an alarm signal when said "alert" tone is present at said audio output; and an alarm connected to said tone detector, said alarm comprising:
   a timer connected to the output of said tone detector, said timer generating an output signal for a predetermined period after the start of the alarm signal from said tone detector;
   an oscillator generating a switching signal;
   a signaling device generating a visual or audible alarm responsive to receipt of a signal at an enable input; and
   a gate having an output connected to the enable input of said signaling device and inputs receiving said output signal from said timer and said switching signal from said oscillator, said gate applying said switching signal to the enable input of said signaling device upon receipt of said output signal from said timer, thereby intermittently enabling said signaling device for said predetermined period.

3. An emergency broadcast alert detector for generating an alarm upon the occurrence of an "alert" tone on at least one of several radio frequencies, comprising:

a radio receiver having an audio output;

scanning means for causing said radio receiver to sequentially receive each of said radio frequencies as determined by the frequency of a local oscillator signal, comprising:
   a local oscillator generating said local oscillator signal, said local oscillator signal having a frequency that determines the radio frequency to which said radio receiver is tuned, said local oscillator generating a local oscillator signal of a predetermined local oscillator frequency that is a function of the logic levels applied to the said frequency selection inputs;
   a clock generator producing a clock signal adapted to cause said local oscillator to sequentially switch among several local oscillator frequencies;
   a sequencer having a clock input and outputs connected to the frequency selection inputs of said local oscillator, said sequencer sequentially applying combinations of logic levels to said local oscillator responsive to clock pulses applied to said clock input; and
   a gate having its output connected to the clock input of said sequencer and inputs receiving said clock signal from said clock generator and a disable signal to gate said clock signal to the clock input of said sequencer when said disable signal is not being generated;

means for generating said disable signal in the event that a signal is received by said radio receiver on one of said radio frequencies, thereby preventing said sequencer from causing said radio receiver to switch from one radio frequency to the next;

tone detector means connected to the audio output of said radio receiver for generating an alarm signal upon detecting said "alert" tone in the signal received by said radio receiver; and alarm means connected to said tone detector means for generating an audible or visual alarm upon receipt of said alarm signal.

4. The emergency broadcast alert detector of claim 3 wherein said local oscillator includes a crystal substantially controlling the frequency of said local oscillator signal, said local oscillator further including a plurality of reactive elements connected to said crystal and a plurality of diodes connected with some of said reactive elements in a manner that switches the reactance of the respective reactive element between two states, depending upon whether or not current is flowing through said diodes, said diodes being connected to the frequency selection inputs of said local oscillator so that the frequency of said local oscillator signal is pulled from the resonant frequency of said crystal by said reactive elements being switched by current flowing from said frequency selection inputs through said diodes.

* * * * *